United States Patent
Kang et al.

(10) Patent No.: US 12,289,095 B2
(45) Date of Patent: Apr. 29, 2025

(54) FILTER SYSTEM INCLUDING RESONATOR

(71) Applicant: SAMSUNG ELECTRONICS CO., LTD., Suwon-si (KR)

(72) Inventors: Sungchan Kang, Hwaseong-si (KR); Cheheung Kim, Yongin-si (KR); Sangha Park, Seoul (KR); Yongseop Yoon, Seoul (KR); Choongho Rhee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 833 days.

(21) Appl. No.: 17/327,117

(22) Filed: May 21, 2021

(65) Prior Publication Data

US 2021/0281242 A1    Sep. 9, 2021

Related U.S. Application Data

(63) Continuation of application No. 16/597,069, filed on Oct. 9, 2019, now Pat. No. 11,050,410, which is a
(Continued)

(30) Foreign Application Priority Data

Oct. 5, 2016    (KR) .................... 10-2016-0128569

(51) Int. Cl.
*H03H 9/54*    (2006.01)
*G01H 11/08*    (2006.01)
(Continued)

(52) U.S. Cl.
CPC ............... *H03H 9/54* (2013.01); *G01H 11/08* (2013.01); *H03H 9/13* (2013.01); *H03H 9/24* (2013.01);
(Continued)

(58) Field of Classification Search
CPC ....... H03H 9/24–2494; H03H 9/46–62; G01H 11/08; H04R 17/10
See application file for complete search history.

(56) References Cited

U.S. PATENT DOCUMENTS 4,306,204 A    12/1981    Johnson
4,373,396 A    2/1983    Johnson
(Continued)

FOREIGN PATENT DOCUMENTS

CN    103166596 A    6/2013
CN    205595376 U    9/2016
(Continued)

OTHER PUBLICATIONS

Communication dated Oct. 27, 2022, issued by the China National Intellectual Property Administration in counterpart Chinese Application No. 201710826616.8.
(Continued)

*Primary Examiner* — Andrea Lindgren Baltzell
*Assistant Examiner* — Alan Wong
(74) *Attorney, Agent, or Firm* — Sughrue Mion, PLLC

(57) ABSTRACT

A filter system includes a first resonator having a first resonant frequency, and a second resonator having a second resonant frequency different from the first resonant frequency, and electrically connected to the first resonator. A first response characteristic of the first resonator and a second response characteristic of the second resonator with respect to a frequency include a first section in which a first phase of the first resonator is equal to a second phase of the second resonator, and a second section in which the first phase is different from the second phase by 180 degrees. A first electrode of the first resonator is reversely connected to a second electrode of the second resonator.

15 Claims, 8 Drawing Sheets

Related U.S. Application Data continuation of application No. 15/643,778, filed on Jul. 7, 2017, now Pat. No. 10,447,238.

(51) Int. Cl.

| | | |
|---|---|---|
| *H03H 9/13* | (2006.01) | |
| *H03H 9/24* | (2006.01) | |
| *H04R 17/02* | (2006.01) | |
| *H04R 17/10* | (2006.01) | |
| *H04R 25/00* | (2006.01) | |

(52) U.S. Cl.
CPC ............. *H04R 17/02* (2013.01); *H04R 17/10* (2013.01); *H04R 25/00* (2013.01); *H04R 2499/13* (2013.01); *H04R 2499/15* (2013.01)

(56) References Cited

U.S. PATENT DOCUMENTS

| | | | |
|---|---|---|---|
| 5,856,722 A | 1/1999 | Haronian et al. | |
| 6,223,601 B1 | 5/2001 | Harada et al. | |
| 6,227,054 B1 | 5/2001 | Ando et al. | |
| 7,002,284 B2 | 2/2006 | Ouchi et al. | |
| 7,417,517 B2 | 8/2008 | Hernandez et al. | |
| 7,561,012 B2 | 7/2009 | Fukunaga | |
| 7,667,375 B2 * | 2/2010 | Berkcan | H02N 2/188 310/330 |
| 7,764,145 B2 | 7/2010 | Iwai | |
| 8,415,863 B2 | 4/2013 | Yamazaki et al. | |
| 10,141,007 B1 * | 11/2018 | Kim | G10L 25/18 |
| 10,356,509 B2 * | 7/2019 | Park | H04R 17/025 |
| 10,447,238 B2 | 10/2019 | Kang et al. | |
| 10,594,296 B2 | 3/2020 | Rhee et al. | |
| 11,050,410 B2 * | 6/2021 | Kang | H03H 9/13 |
| 2016/0197597 A1 | 7/2016 | Yamada et al. | |
| 2018/0038901 A1 | 2/2018 | Kim et al. | |
| 2018/0131347 A1 | 5/2018 | Rhee et al. | |
| 2019/0028084 A1 | 1/2019 | Yoon et al. | |
| 2019/0028799 A1 | 1/2019 | Park et al. | |

FOREIGN PATENT DOCUMENTS

| | | |
|---|---|---|
| EP | 2 986 024 A1 | 2/2016 |
| JP | 200760618 A | 3/2007 |
| JP | 2015-144372 A | 8/2015 |
| KR | 1020100022873 A | 3/2010 |

OTHER PUBLICATIONS

"RF filter design basics", RF Technology & Design, Retrieved from http://www.radio-electronics.com/info/rf-technology-design/ Retrieved on Jul. 6, 2017. Total 9 pages.

"Saw Filters", 1989, pp. 69-71 (Total 3 pages).

Communication issued by the European Patent Office on Jan. 17, 2018 in counterpart European Patent Application No. 17184393.1.

Jongmoon Jang, et al., "A microelectromechanical system artificial basilar membrane based on a piezoelectric cantilever array and its characterization using an animal model", Nature—Scientific Reports, 5:12447, Published Jul. 31, 2015, Total 13 pages.

R.J. Wilfinger et al., "Speech Coder Utilizing Semiconductor Cantilevers", IBM Technical Disclosure Bulletin, International Business Machinese Corp., Jan. 1, 1968, pp. 1259 (total 1 page), vol. 10, No. 8, XP-002135857.

Robert Weigel, et al; "Microwave Acoustic Materials, Devices, and Applications", IEEE Transactions on Microwave Theory and Techniques, vol. 50, No. 3, Mar. 2002, pp. 738-749.

* cited by examiner

FILTER SYSTEM INCLUDING RESONATOR

CROSS-REFERENCE TO RELATED APPLICATION

This application is a continuation application of U.S. patent application Ser. No. 16/597,069, filed Oct. 9, 2019, which is a continuation application of U.S. patent application Ser. No. 15/643,778, filed Jul. 7, 2017, now U.S. Pat. No. 10,447,238, issued on Oct. 15, 2019; in the U.S. Patent and Trademark Office, which claims priority from Korean Patent Application No. 10-2016-0128569, filed on Oct. 5, 2016, in the Korean Intellectual Property Office, the disclosures of which are incorporated herein by reference in their entireties.

BACKGROUND

1. Field

Apparatuses consistent with example embodiments relate to filter systems, and more particularly, to filter systems including resonators.

2. Description of the Related Art

To filter a signal in an acoustic frequency band of a range, a mechanical resonator or an electrical analog or digital filter may be used.

Various characteristics may be used to assess the performance of filters. For example, a transition region (skirt) may be an indicator showing how a pass-band and a stop-band of a signal obtained by filtering a signal of an acoustic frequency band are clearly distinguished from each other. When a result obtained by filtering the acoustic frequency band by a filter has a narrow transition region, and a pass-band and a stop-band thereof are clearly distinguished from each other, the performance of the filter may be regarded as good.

SUMMARY

Example embodiments may address at least the above problems and/or disadvantages and other disadvantages not described above. Also, the example embodiments are not required to overcome the disadvantages described above, and may not overcome any of the problems described above.

Filter systems including at least two resonators are provided.

According to an aspect of an example embodiment, there is provided a filter system including a first resonator having a first resonant frequency, and a second resonator having a second resonant frequency different from the first resonant frequency, and electrically connected to the first resonator. A first response characteristic of the first resonator and a second response characteristic of the second resonator with respect to a frequency include a first section in which a first phase of the first resonator is equal to a second phase of the second resonator, and a second section in which the first phase is different from the second phase by 180 degrees. A first electrode of the first resonator is reversely connected to a second electrode of the second resonator.

The first resonator may include a first sensor unit, and the second resonator may include a second sensor unit.

The first sensor unit may include a first lower electrode, a first piezo-material layer, and a first upper electrode, the second sensor unit may include a second lower electrode, a second piezo-material layer, and a second upper electrode, and the first upper electrode may be electrically connected to the second lower electrode.

The first sensor unit may include a first lower electrode, a first piezo-material layer, and a first upper electrode, the second sensor unit may include a second lower electrode, a second piezo-material layer, and a second upper electrode, and the first lower electrode may be electrically connected to the second upper electrode.

The filter system may further include a fixing unit, the first resonator may further include a first supporting unit extending from the fixing unit, the first supporting unit having a first side on which the first sensor unit is disposed, and the second resonator may further include a second supporting unit extending from the fixing unit, the second supporting unit having a second side on which the second sensor unit is disposed.

The first supporting unit may have a first length different from a second length of the second supporting unit.

The first section may be a frequency region less than the first resonant frequency or greater than the second resonant frequency.

In the first section, a response characteristic of the filter system with respect to the frequency may be reduced as much as a difference between a first value of the first response characteristic and a second value of the second response characteristic with respect to the frequency.

The second section may be a frequency region between the first resonant frequency and the second resonant frequency.

In the second section, a response characteristic of the filter system with respect to the frequency, according to a sum of a first value of the first response characteristic and a second value of the second response characteristic with respect to the frequency, may be maintained constant.

According to an aspect of an example embodiment, there is provided a filter system including an array of resonator groups, each of the resonator groups including a first resonator having a first resonant frequency, and a second resonator having a second resonant frequency different from the first resonant frequency, and electrically connected to the first resonator. A first response characteristic of the first resonator and a second response characteristic of the second resonator with respect to a frequency include a first section in which a first phase of the first resonator is equal to a second phase of the second resonator, and a second section in which the first phase is different from the second phase by 180 degrees. A first electrode of the first resonator is reversely connected to a second electrode of the second resonator.

The resonator groups may include a first resonator group through an nth resonator group, n may be an integer greater than 2, and a resonant frequency difference between resonators included in a resonator group among the resonator groups may be less than a resonant frequency difference between resonators of another resonator group among the resonator groups.

The resonator groups may include a first resonator group and a second resonator group, the first resonator group may include an 1-1 resonator and an 1-2 resonator, the second resonator group may include a 2-1 resonator and a 2-2 resonator, and a resonant frequency difference between the 1-1 resonator and the 1-2 resonator may be less than a resonant frequency difference between the 2-1 resonator and the 2-1 resonator.

The 1-1 resonator, the 1-2 resonator, the 2-1 resonator, and the 2-2 resonator may include piezo-sensors.

A first piezo-sensor of the 1-1 resonator among the piezo-sensors may include a first lower electrode and a first upper electrode, a second piezo-sensor of the 1-2 resonator among the piezo-sensors may include a second lower electrode and a second upper electrode, and the first upper electrode may be electrically connected to the second lower electrode.

A first piezo-sensor of the 1-1 resonator among the piezo-sensors may include a first lower electrode and a first upper electrode, a second piezo-sensor of the 1-2 resonator among the piezo-sensors may include a second lower electrode and a second upper electrode, and the first lower electrode may be electrically connected to the second upper electrode.

The filter system may further include a fixing unit, the 1-1 resonator may further include a first supporting unit extending from the fixing unit, the first supporting unit having a first side on which a first piezo-sensor of the 1-1 resonator, among the piezo-sensors, is disposed, and the 1-2 resonator may further include a second supporting unit extending from the fixing unit, the second supporting unit having a second side on which a second piezo-sensor of the 1-2 resonator, among the piezo-sensors, is disposed.

The first supporting unit may have a first length different from a second length of the second supporting unit.

According to an aspect of an example embodiment, there is provided a filter system including a first resonator having a first resonant frequency, and including a first lower electrode and a first upper electrode disposed on the first lower electrode, and a second resonator having a second resonant frequency different from the first resonant frequency, and including a second lower electrode and a second upper electrode disposed on the second lower electrode. The first upper electrode is electrically connected to the second lower electrode, or the first lower electrode is electrically connected to the second upper electrode.

The filter system may further include a fixing unit, the first resonator may further include a first supporting unit extending from the fixing unit, the first supporting unit having a first side on which the first upper electrode and the first lower electrode are disposed, the second resonator may further include a second supporting unit extending from the fixing unit, the second supporting unit having a second side on which the second upper electrode and the second lower electrode are disposed, the first resonator may further include a first mass unit and a first material layer disposed on a first opposite side opposite to the first side of the first supporting unit, and the second resonator may further include a second mass unit and a second material layer disposed on a second opposite side opposite to the second side of the second supporting unit.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
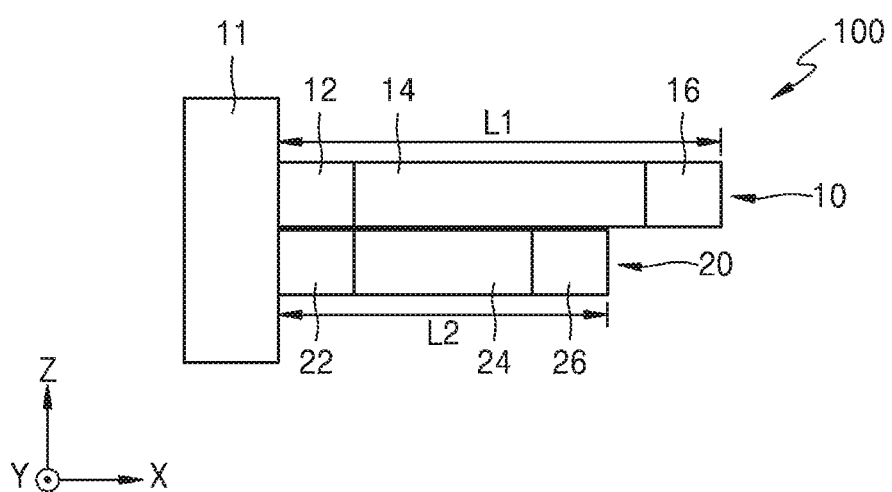
FIG. 1 is a plan view of a filter system including resonators, according to an example embodiment.

Reference will now be made in detail to example embodiments, examples of which are illustrated in the accompanying drawings. In the drawings, like reference numerals refer to like elements throughout and sizes and thicknesses of each constituent element may be exaggerated for clarity of explanation. It will be understood that when a predetermined material layer is referred to as being present on a substrate or another layer, the predetermined material layer may be present by directly contacting the substrate or another layer or a third layer may be present between the predetermined material layer and the substrate or another layer. Also, materials that constitute each layer in the example embodiments below are examples, and thus, other material may be used to constitute each layer.

Figure 2A:
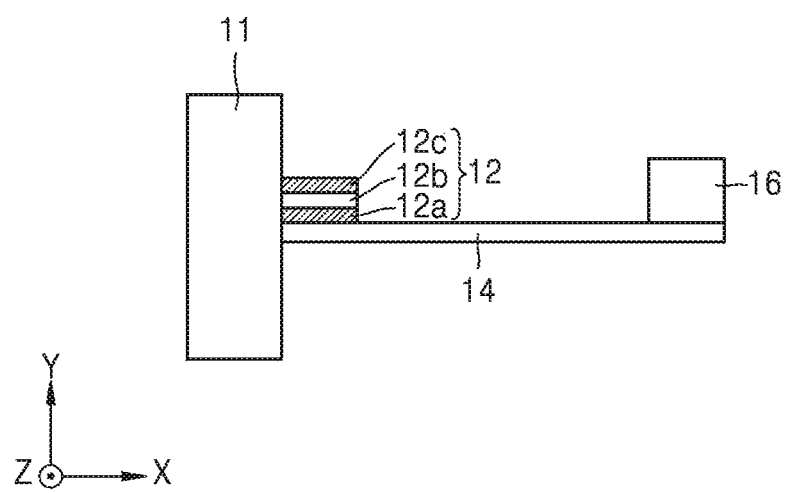
FIGS. 2A and 2B are cross-sectional views of the filter system including the resonators, according to example embodiments.
Figure 2B:
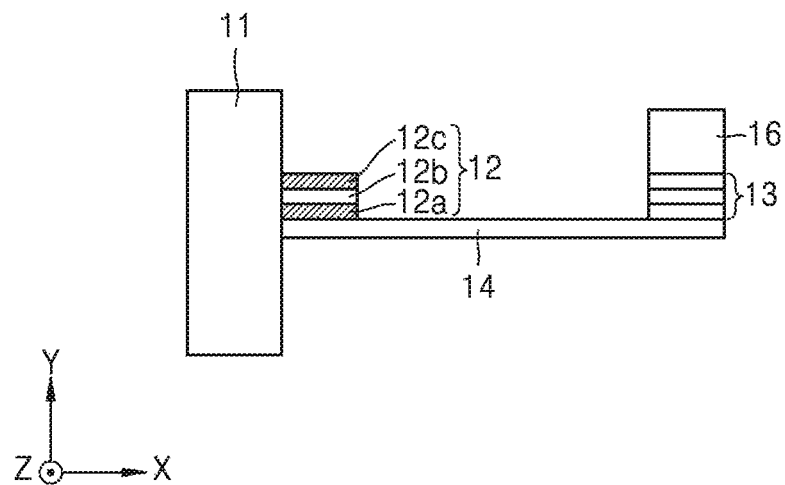

FIG. 1 is a plan view of a filter system 100 including resonators 10 and 20, according to an example embodiment. FIGS. 2A and 2B are cross-sectional views of the filter system 100 including the resonators 10 and 20, according to example embodiments.

Referring to FIGS. 1 and 2A, the filter system 100 according to an example embodiment may include at least two resonators 10 and 20. The resonators 10 and 20 may be referred to as a first resonator 10 and a second resonator 20, respectively. The first and second resonators 10 and 20 may respectively include a fixing unit 11 and first and second supporting units 14 and 24 that extend in a direction, for example, an x-direction. First and second sensor units 12 and 22 and first and second mass units 16 and 26 may respectively be formed on the first and second supporting units 14 and 24.

In detail, the first sensor unit 12 and the first mass unit 16 may be formed on the first supporting unit 14 of the first resonator 10. The second sensor unit 22 and the second mass unit 26 may be formed on the second supporting unit 24 of the second resonator 20. The first and second sensor units 12 and 22 and the first and second mass units 16 and 26 may be respectively formed on both edges of the first and second supporting units 14 and 24. The first and second sensor units 12 and 22 may be respectively formed on side edges of the first and second supporting units 14 and 24 that are adjacent to the fixing unit 11. The first and second mass units 16 and 26 may be respectively formed on the other side edges of the first and second supporting units 14 and 24 that are located relatively away from the fixing unit 11.

The fixing unit 11 is a region from which the first and second supporting units 14 and 24 extend. The fixing unit 11 may include a material used as a substrate of an electronic device, and the material is not limited thereto. The first and second supporting units 14 and 24 may have a beam shape, and may be referred to as a cantilever. Ends of the first and second supporting units 14 and 24 are fixed on the fixing unit 11, and the other ends of the first and second supporting units 14 and 24 are not fixed by other materials but may have a free shape. The first and second supporting units 14 and 24 may include Si, etc.

The first and second sensor units 12 and 22 may be respectively formed on edges of the first and second supporting units 14 and 24 that are regions protruding from the fixing unit 11. In the filter system including resonators according to an example embodiment, the first and second sensor units 12 and 22 may be piezo-sensors. The first sensor unit 12 may have a structure in which an upper electrode 12c and a lower electrode 12a are respectively formed on and under a piezo-material layer 12b. That is, the first sensor unit 12 may include the lower electrode 12a on the first supporting unit 14, the piezo-material layer 12b on the lower electrode 12a, and the upper electrode on the piezo-material layer 12b. The second sensor unit 22 may have the same structure as the first sensor unit 12.

The lower electrode 12a and the upper electrode 12c of the first and second sensor units 12 and 22 may include a metal material, such as molybdenum. The piezo-material layer 12b may include any piezo-material that may be used in piezo-sensors. The piezo-material may include, for example, AlN, ZnO, SnO, PZT, ZnSnO$_3$, Polyvinylidene fluoride (PVDF), poly(vinylidene fluoride-trifluoroethylene) (P(VDF-TrFE)) or PMN-PT.

Materials to be used to form the first mass unit 16 formed on the other edges of the first and second supporting units 14 and 24 may not be specifically limited. The first mass unit 16 may include a metal, for example, Au. The first and second supporting units 14 and 24 and the first and second mass units 16 and 26 (except for the first and second sensor units 12 and 22) of the first and second resonators 10 and 20 may be non-sensor units. An insulating layer may further be optionally formed between the lower electrode 12a and the first supporting unit 14.

FIG. 2B is a cross-sectional view of the first resonator 10 of FIG. 1 that is cut in a z-axis direction. The second resonator 20 may have the same structure as the first resonator 10. FIG. 2B shows a structure in which a material layer 13 is additionally formed between the first supporting unit 14 and the first mass unit 16. The material layer 13 may be arbitrarily formed when the first and second resonators 10 and 20 are designed, or may be simultaneously formed with the first and second sensor units 12 and 22 by using a material used to form the first and second sensor units 12 and 22. The material layer 13 may perform substantially the same function as the first and second mass units 16 and 26.

In the case of the filter system 100 according to the current example embodiments, the first resonator 10 and the second resonator 20 may have different resonant frequencies from each other. For example, the first resonator 10 may have a resonant frequency of f1, and the second resonator 20 may have a resonant frequency of f2. The resonant frequencies of the first and second resonators 10 and 20 may vary according to the structures of the first and second supporting units 14 and 24, and may be determined according to lengths of the first and second supporting units 14 and 24 if other conditions, such as thicknesses and widths of the first and second supporting units 14 and 24 of the first and second resonators 10 and 20, are the same. The first supporting unit 14 of the first resonator 10 may have a length L1, and the second supporting unit 24 of the second resonator 20 may have a length L2. The length L1 of the first supporting unit 14 of the first resonator 10 and the length L2 of the second supporting unit 24 of the second resonator 20 may be different from each other. Accordingly, the resonant frequency f1 of the first resonator 10 and the resonant frequency f2 of the second resonator 20 may be different from each other.

In the filter system 100 including the resonators according to the current example embodiments, when a vibration, sound, or a force is applied from the outside of the first and second resonators 10 and 20, an inertial force may be generated according to the behavior of the first and second mass units 16 and 26. A resonance may be generated when resonant frequencies of the first and second supporting units 14 and 24 are matched to a frequency of an external vibration, sound, or force, and in this case, an inertial force may be increased. The inertia force causes a bending moment of the first and second sensor units 12 and 22, and the bending moment causes stress to be applied to each layer of the first and second sensor units 12 and 22. The piezo-material layer 12b may generate an amount of charges in proportion to the stress applied to the piezo-material layer 12b, and thus, a voltage is generated in reverse proportion to a capacitance between the lower and upper electrodes 12a and 12c. As a result, in the filter system including resonators according to the current example embodiments, a voltage generated in the first and second sensor units 12 and 22 by an external affect, such as vibration, sound, or force from the outside of the first and second resonators 10 and 20, is detected and analyzed, and thus, information about the external affect, such as vibration, sound, or force, may be obtained.

Figure 3A:
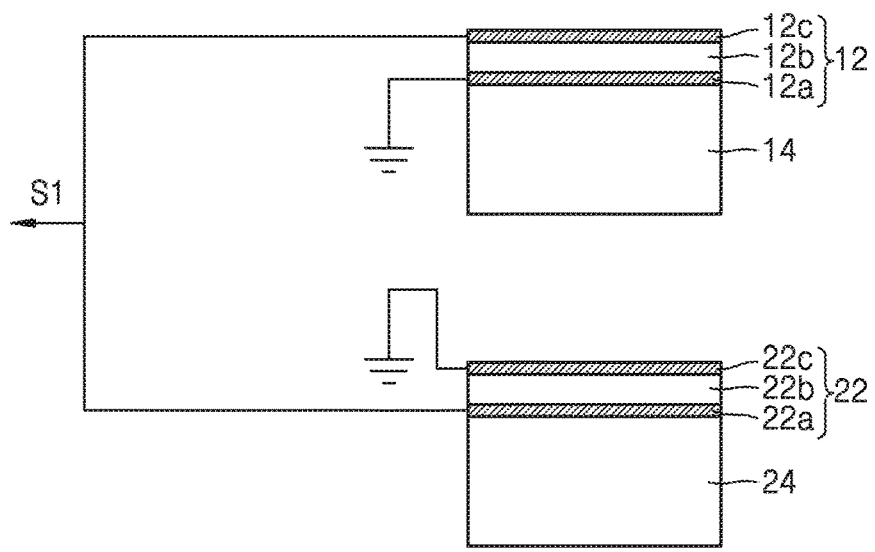
FIGS. 3A and 3B are cross-sectional views showing electrode-connection relationships between the resonators of the filter system, according to example embodiments.
Figure 3B:
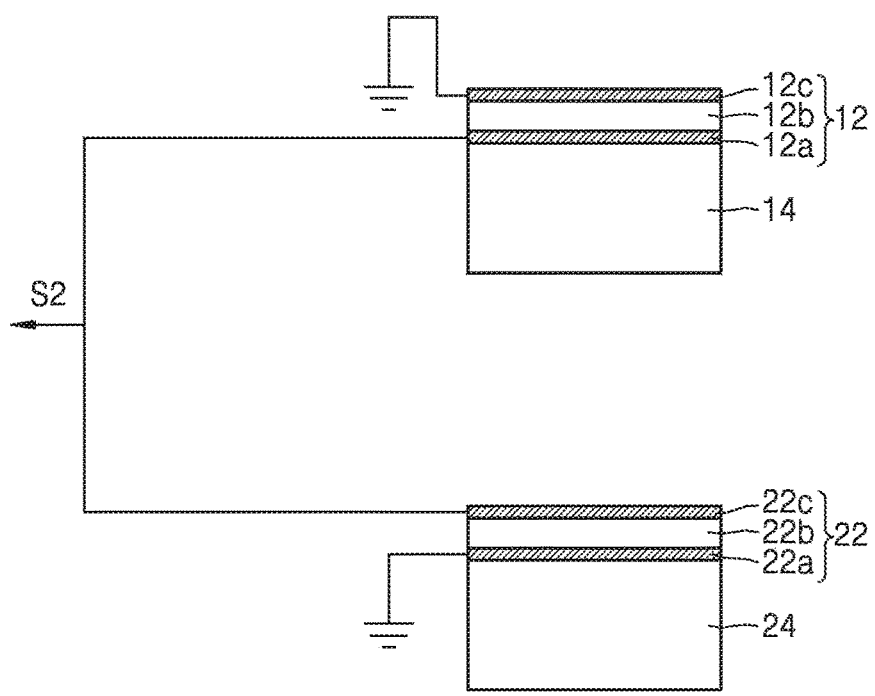

FIGS. 3A and 3B are cross-sectional views showing electrode-connection relationships between the resonators 10 and 20 of the filter system 100, according to example embodiments. FIGS. 3A and 3B show only the first and second sensor units 12 and 22 respectively on the first and second supporting units 14 and 24 of the first and second resonators 10 and 20 of FIG. 1.

Referring to FIGS. 1, 3A, and 3B, the filter system 100 including the resonators 10 and 20 according to example embodiments may have a reversely connected-electrode structure in which electrodes 12a, 12c, 22a, and 22c of adjacent two resonators, for example, the first and second resonators 10 and 20, are reversely connected to each other. In the current specification, the description "the electrodes 12a, 12c, 22a, and 22c of the first and second resonators 10 and 20 have a 'reversely connected-electrode structure'" may denote that an upper electrode of one of adjacent two resonators and a lower electrode of the other one of the adjacent two resonators may be electrically connected to each other, or a lower electrode of one of the adjacent two resonators and an upper electrode of the other one of the adjacent two resonators may be electrically connected to each other. In detail, as depicted in FIG. 3A, the upper electrode 12c of the first resonator 10 may be electrically connected to the lower electrode 22a of the second resonator 20 (51). In this case, the lower electrode 12a of the first resonator 10 and the upper electrode 22c of the second resonator 20 may be connected to the ground. Also, as depicted in FIG. 3B, the lower electrode 12a of the first resonator 10 may be electrically connected to the upper electrode 22c of the second resonator 20 (S2). In this case, the upper electrode 12c of the first resonator 10 and the lower electrode 22a of the second resonator 20 may be connected to the ground.

Also, in the current specification, the lower electrodes 12a and 22a may denote electrodes formed by directly contacting the first and second supporting units 14 and 24, respectively, or electrodes formed adjacent to the first and second supporting units 14 and 24, respectively. Also, the upper electrodes 12c and 22c may denote electrodes spaced apart from the first and second supporting units 14 and 24, respectively, and directly formed on the piezo-material layers 12b and 22b, respectively.

The electrode-connection structure between the first and second resonators 10 and 20 depicted in FIGS. 3A and 3B may be applied to another example embodiment of the inventive concept without limitation. For example, resonators in a resonator group P1, P2, P3, ... Pn of a filter system 300 including resonators of FIG. 8 may have the same electrode structure as shown in FIGS. 3A and 3B.

In the case of the filter system 100 according to the current example embodiments, the first and second resonators 10 and 20 may respectively be have a resonant frequency f1 and a resonant frequency f2. Because the length of the first supporting unit 14 of the first resonator 10 is different from that of the second supporting unit 24 of the second resonator 20, the resonant frequencies f1 and f2 may be different. Here, it is assumed that resonant frequency f2 is greater than resonant frequency f1 (f1<f2).

Figure 4A:
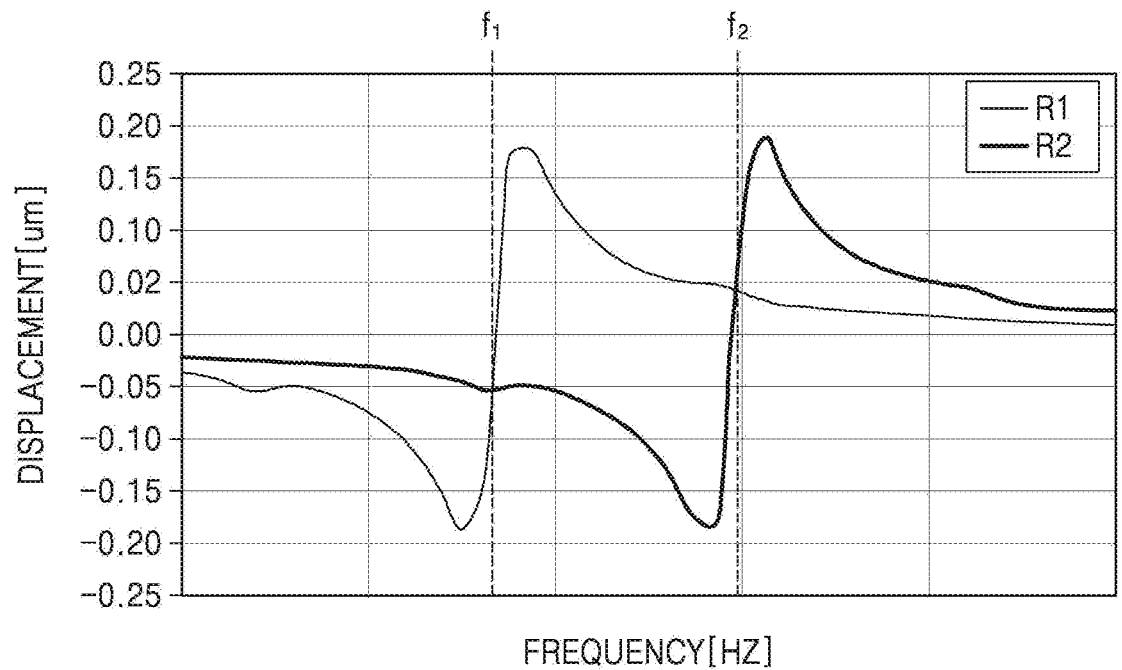
FIGS. 4A and 4B are graphs showing response characteristics with respect to frequencies of resonators respectively having resonant frequencies of f1 and f2, according to an example embodiment.
Figure 4B:
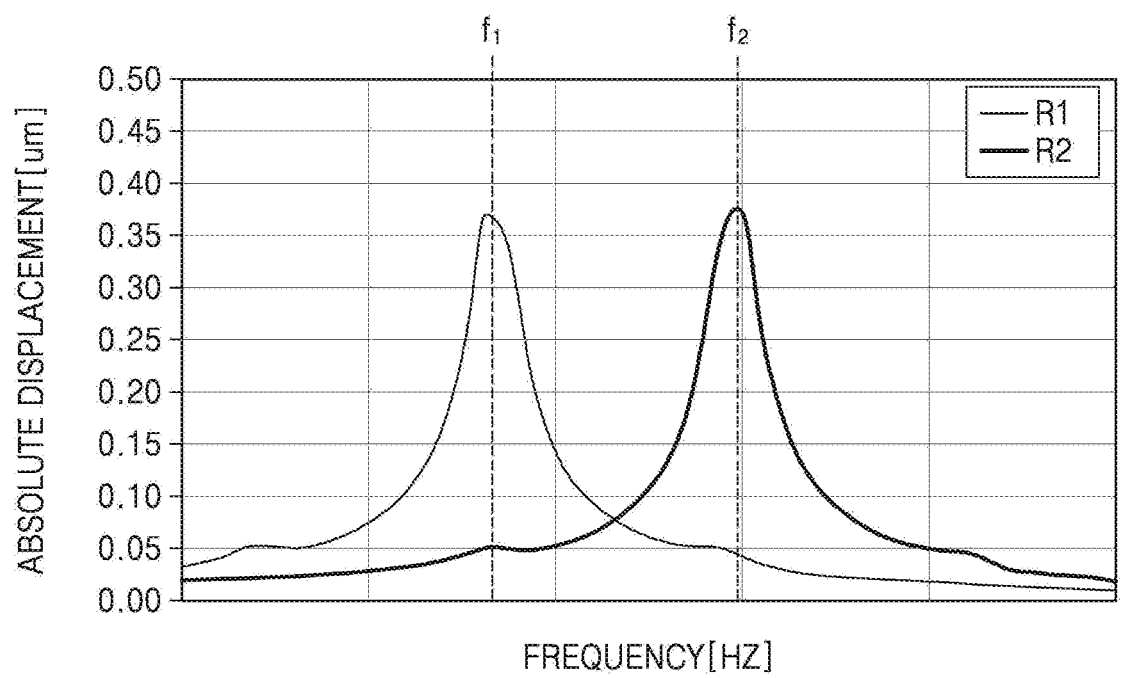

FIGS. 4A and 4B are graphs showing response characteristics with respect to frequencies of resonators respectively having resonant frequencies of f1 and f2, according to an example embodiment. The horizontal axis of FIGS. 4A and 4B indicates wavelengths, the vertical axis of FIG. 4A indicates displacement value in consideration of phase, and the vertical axis of FIG. 4B indicates absolute displacement value.

In the case of the mechanical resonator of FIG. 1, a phase may be changed to 180 degrees before and after the resonant frequencies f1 and f2. Referring to FIG. 4A, a response characteristic of the first resonator 10 having a resonant frequency f1 may be expressed as a response characteristic R1, and a response characteristic of the second resonator 20 having a resonant frequency f2 may be expressed as a response characteristic R2. When an absolute displacement value is considered without considering a phase, a response characteristic of the first resonator 10 having a resonant frequency f1 and a response characteristic of the second resonator 20 having a resonant frequency f2 may be respectively expressed as the response characteristics R1 and R2 of FIG. 4B.

In FIG. 4A, a section in which a phase of the response characteristic R1 according to a frequency of the first resonator 10 and a phase of the response characteristic R2 according to a frequency of the second resonator 20 are the same may be referred to as a first section. In detail, the first section may denote a frequency section smaller than the resonant frequency f1 of the first resonator 10 and the resonant frequency f2 of the second resonator 20 (f<f1, f2), or a frequency section greater than the resonant frequency f1 of the first resonator 10 and the resonant frequency f2 of the second resonator 20 (f>f1, f2). The first section may be referred to as an 'in phase section'. Also, in FIG. 4A, a section in which a phase of the response characteristic R1 according to a frequency of the first resonator 10 and a phase of the response characteristic R2 according to a frequency of the second resonator 20 are opposite to each other may be referred to as a second section. In detail, the second section may denote a frequency section between the resonant frequency f1 of the first resonator 10 and the resonant frequency f2 of the second resonator 20 (f1<f<f2). The second section may be referred to as an 'out of phase section'.

Figure 5:
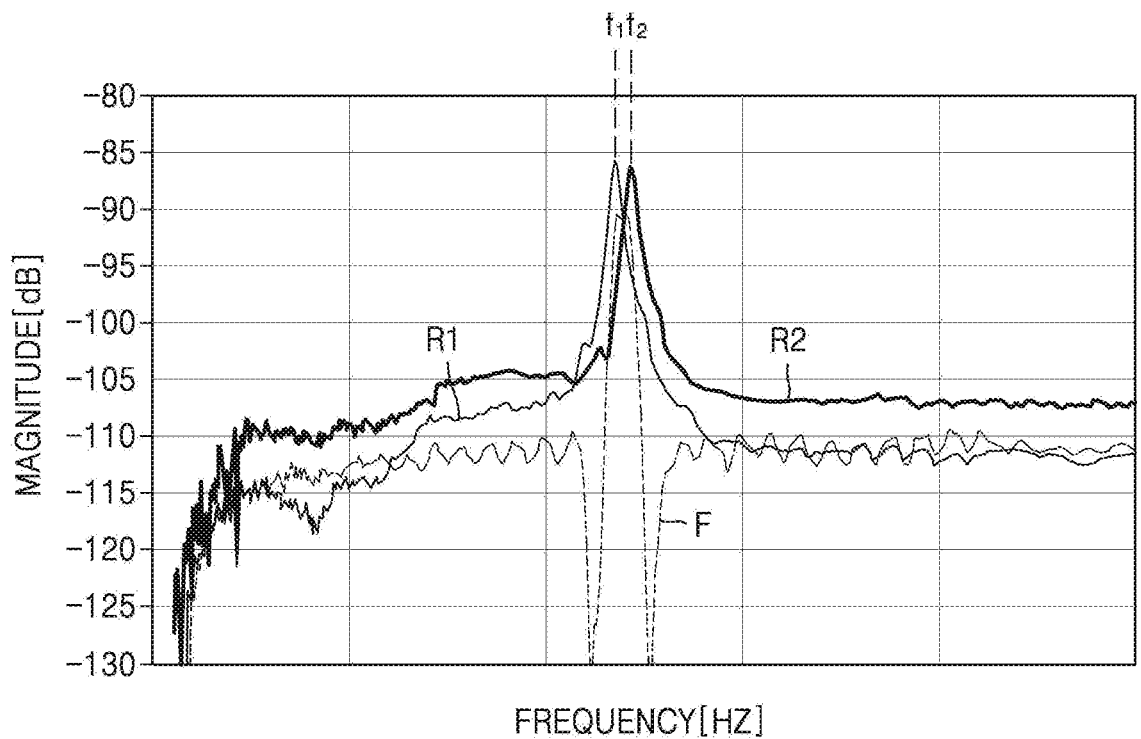
FIG. 5 is a graph showing a response characteristic with respect to a frequency of a filter system including resonators, according to an example embodiment.

In the case of the first and second resonators 10 and 20, as depicted in FIG. 3A or FIG. 3B, electrodes may have a reversely connected-electrode structure, and, as depicted in FIG. 5, a response characteristic F according to a frequency may be obtained.

FIG. 5 is a graph showing the response characteristic F with respect to the frequency of a filter system including resonators, according to an example embodiment.

Referring to FIG. 5, in the first section in which a frequency is smaller than the resonant frequency f1 or greater than the resonant frequency f2, that is, in the 'in phase section', a signal may be reduced as much as the difference of response characteristic value according to the frequencies of the first and second resonators 10 and 20. This is expressed as Equation 1. For reference, in the first section, that is, in the 'in phase section', values of the response characteristics R1 and R2 are different from each other.

$$F=|(R1+R2)/2|_{(f<f1,f2 \text{ or } f>f1,f2)}$$ [Equation 1]

Also, in the second section, that is, the 'out of phase section', a signal may be maintained by a sum of the response characteristic values according to frequencies of the first and second resonators 10 and 20. This is expressed as Equation 2.

$$F=|(R1-R2)/2|_{(f1<f<f2)}$$ [Equation 2]

Accordingly, the response characteristic of a filter system including resonators according to the current example embodiment may be obtained as F in FIG. 5. That is, a high signal may be obtained in the 'out of phase section' between the resonant frequency f1 of the first resonator 10 and the resonant frequency f2 of the second resonator 20. However, a signal is greatly reduced in the 'in phase section', that is, both outsides of the resonant frequencies f1 and f2, and thus, a sharp inclination is expressed. In this case, a signal value is largely reduced on both outsides of the resonant frequencies f1 and f2 that are boundaries between the first section and the section. Accordingly, the filter system including resonators according to the current example embodiment may obtain a transition region or skirt having a narrow width and a very large inclination. A filter characteristic in which a transition region having a narrow width and a very large inclination is referred to as a sharp skirt characteristic.

Figure 6:
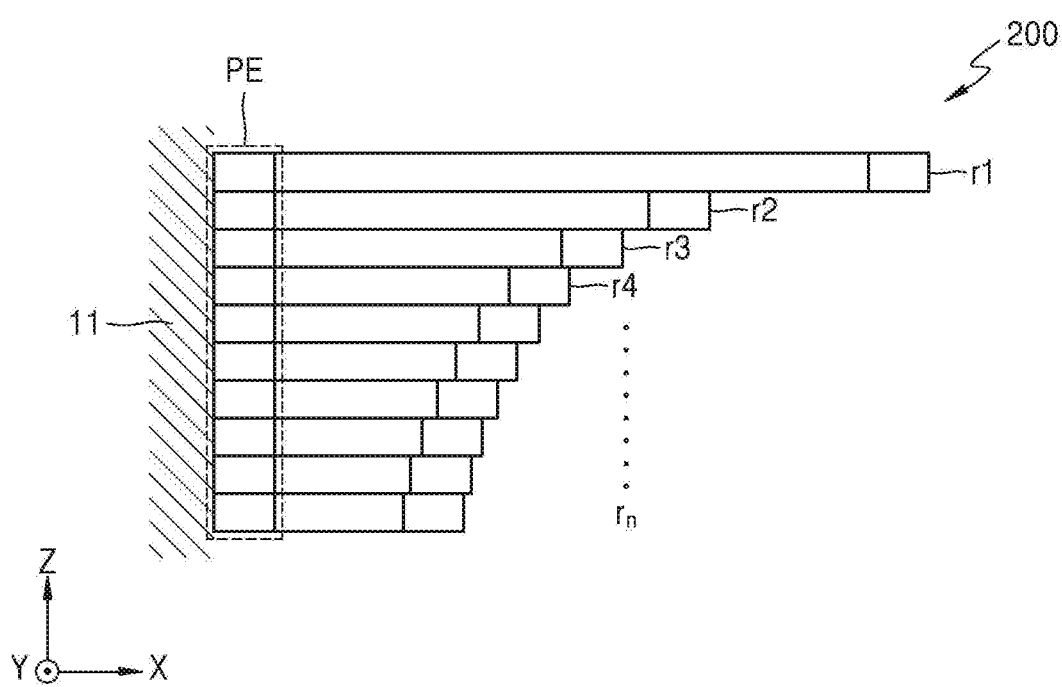
FIG. 6 is a plan view of a filter system including a plurality of resonators, according to an example embodiment.

FIG. 6 is a plan view of a filter system 200 including a plurality of resonators, according to another example embodiment.

Referring to FIG. 6, the filter system 200 including resonators according to the current example embodiment may have a structure in which more than two resonators are included. The filter system 100 depicted in FIG. 1 includes two resonators, that is, the first and second resonators 10 and 20. However, the example embodiments according to the inventive concept are not limited thereto, that is, as depicted in FIG. 6, the number of resonators r1, r2, r3, r3, r4, ... and rn is not limited. The resonators r1, r2, r3, r3, r4, ... and rn may have an array structure by protruding and extending from the fixing unit 11. Piezo-sensors PE may be formed on an edge of each of the resonators r1, r2, r3, r3, r4, ... and rn adjacent to the fixing unit 11. As depicted in FIG. 6, the resonators r1, r2, r3, r3, r4, ... and rn may have lengths different from each other, and resonant frequencies of the resonators r1, r2, r3, r3, r4, . . . and rn may be different from each other.

Figure 7A:
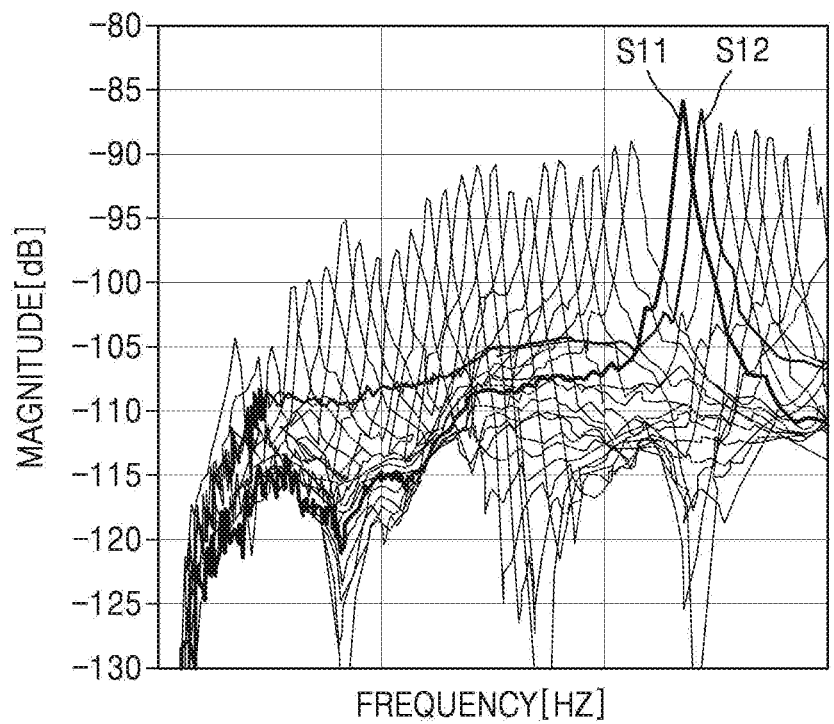
FIG. 7A is a graph showing response characteristics with respect to frequencies of a plurality of resonators, according to an example embodiment.
Figure 7B:
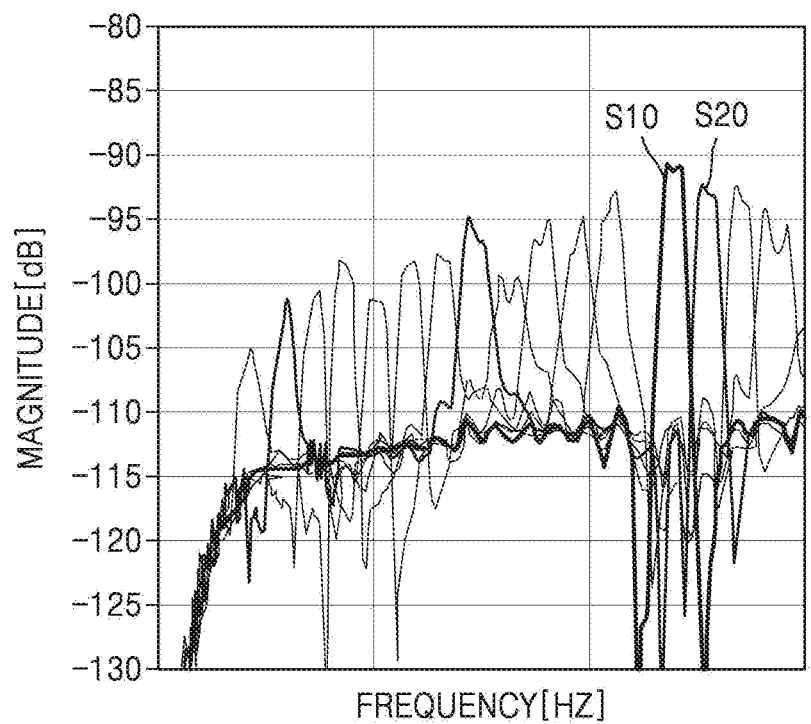
FIG. 7B is a graph showing response characteristics with respect to a frequency of a filter system including a plurality of resonators, according to an example embodiment.

FIG. 7A is a graph showing response characteristics with respect to frequencies of a plurality of resonators, according to an example embodiment. FIG. 7B is a graph showing response characteristics with respect to a frequency of a filter system including a plurality of resonators, according to an example embodiment.

Referring to FIG. 7A, the response characteristics of each of the resonators r1, r2, r3, r3, r4, . . . and rn with respect to a frequency may be differently expressed from each other because resonant frequencies of the resonators r1, r2, r3, r3, r4, . . . and rn depicted in FIG. 6 are different from each other. For example, graphs S11 and S12 represent response characteristics with respect to frequencies of adjacent two resonators of the resonators r1, r2, r3, r3, r4, . . . and rn. The above response characteristics with respect to frequency are measured by measuring a voltage signal generated from the resonators r1, r2, r3, r3, r4, . . . and rn of the filter system according to the current example embodiment after generating a sound from a speaker by varying the frequency.

Referring to FIG. 7B, after reversely and electrically connecting electrodes of two adjacent resonators of the resonators r1, r2, r3, r3, r4, . . . and rn of FIG. 6, the response characteristics with respect to frequencies are investigated. It is seen that a width of a transition region is narrow and an inclination of the transition region is very large. For example, in the case of graphs S10 and S20, the graphs S10 and S20 have a narrow width transition region that is a region of the graph going down from an upper end towards a down end, and have a very large inclination when compared to the frequency response characteristics of the graphs S11 and S12 of the resonators of FIG. 7A. In this manner, in a filter system including resonators according to the current example embodiment, the filter system may express a sharp skirt, that is, a transition region having a narrow width and a very large inclination.

Figure 8:
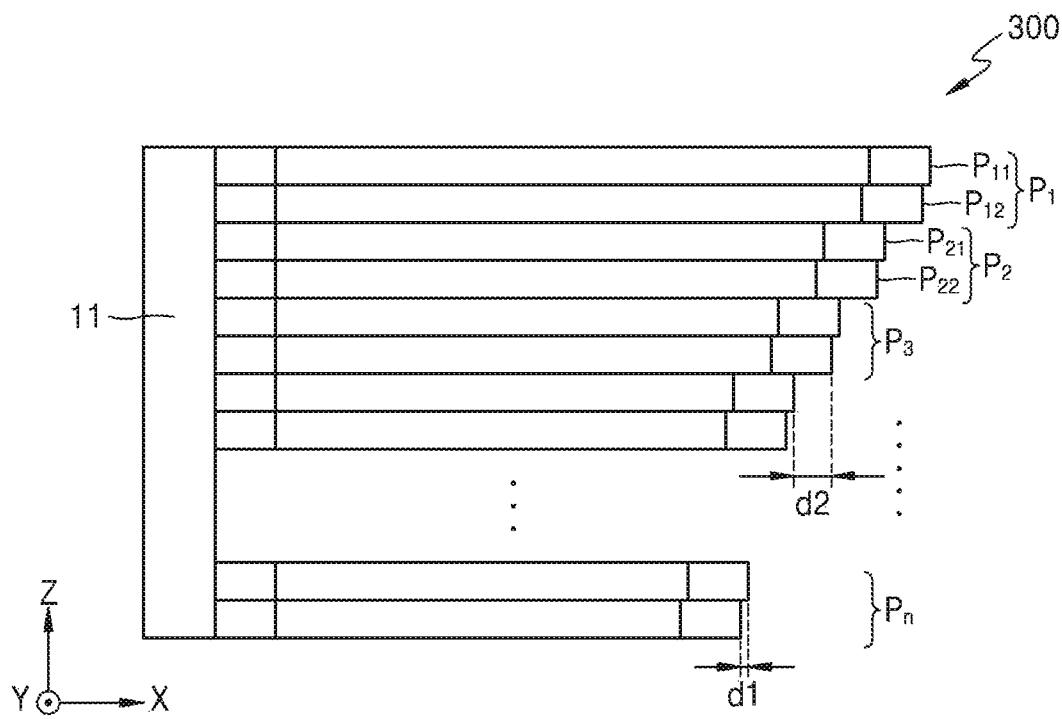
FIG. 8 is a plan view of a filter system including resonators, according to another example embodiment.

FIG. 8 is a plan view of a filter system 300 including resonators, according to another example embodiment. FIG. 8 shows an array of a plurality of resonator groups.

Referring to FIG. 8, the filter system 300 including resonators according to another example embodiment may include a plurality of resonators P11, P12, P21, P22, . . . , and each of the resonators P11, P12, P21, P22, . . . may have different resonant frequencies from each other. Here, the resonators P11, P12, P21, P22, . . . of the filter system 300 may be divided into a plurality of resonator groups P1, P2, P3, . . . and Pn. For example, the resonators P11 and P12 may constitute a first resonator group P1, and the resonators P21 and P22 may constitute a second resonator group P2. In this manner, the filter system 300 may include the first resonator group P1 through an nth resonator group Pn (here, n is an integer greater than 2).

Resonators of the first through nth resonator groups P1, P2, P3, . . . and Pn may have different resonant frequencies from each other. However, the resonators P11, P12, P21, P22, . . . included in the first through nth resonator groups P1, P2, P3, . . . and Pn may have resonant frequencies of very similar magnitude to each other. For example, the first resonator group P1 may include the 1-1 resonator P11 and the 1-2 resonator P12. The 1-1 resonator P11 and the 1-2 resonator P12 may not have the same resonant frequencies, but a difference therebetween may be very small. Also, the second resonator group P2 may include the 2-1 resonator P21 and the 2-2 resonator P22. The 2-1 resonator P21 and the 2-2 resonator P22 may not have the same resonant frequencies, but a difference therebetween may be very small.

A resonant frequency difference between the resonators formed in the same resonator groups P1, P2, P3, . . . and Pn may be, as described above, very small, and when compared to the resonators of the other resonator groups P1, P2, P3, . . . and Pn, the resonant frequency difference may further be small. For example, a resonant frequency difference between the 1-1 resonator P11 and the 1-2 resonator P12 of the first resonator group P1 may be smaller than a resonant frequency difference between the 1-1 resonator P11 and the 2-1 resonator P21 of the second resonator group P2. Also, a resonant frequency difference between the 2-1 resonator P21 and the 2-2 resonator P22 of the second resonator group P2 may be smaller than a resonant frequency difference between the 2-1 resonator P21 and the 1-1 resonator P11 of the first resonator group P1.

As depicted in FIG. 1, the resonant frequencies of the resonators P11, P12, P21, P22, . . . may be determined according to lengths of supporting units of the resonators P11, P12, P21, P22, . . . . A length difference d1 between the resonators in the nth resonator group Pn may be smaller than a length difference d2 between the resonator groups P1, P2, P3, . . . and Pn.

Figure 9:
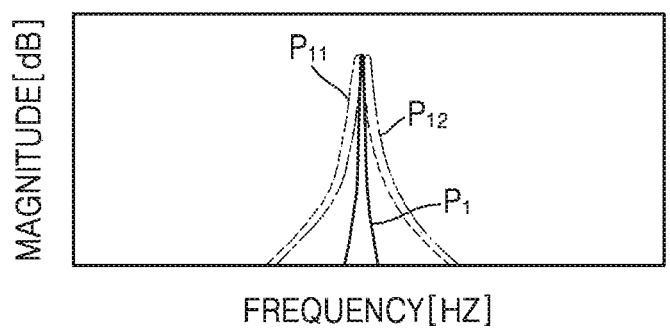
FIG. 9 is a graph showing a response characteristic of the filter system including the resonators of FIG. 8.

FIG. 9 is a graph showing a response characteristic of the filter system 300 including the resonators of FIG. 8 with respect to a frequency. Here, the response characteristics of the 1-1 resonator P11 and the 1-2 resonator P12 of the first resonator group P1 are shown.

Referring to FIG. 9, it is seen that a frequency response characteristic graph Pu of the 1-1 resonator P11 is very similar to a frequency response characteristic graph P12 of the 1-2 resonator P12. This is because, as depicted in FIG. 8, the resonant frequencies of the 1-1 resonator P11 and the 1-2 resonator P12 in the same resonator group P1 are very similar to each other, and the supporting units 14 and 24 of the 1-1 resonator P11 and the 1-2 resonator P12 may have lengths similar to each other.

A bandwidth of graph Pu that expresses the frequency response characteristic of the first resonator group P1 may be controlled according to a resonant frequency difference between the 1-1 resonator P11 and the 1-2 resonator P12. That is, when the resonant frequency difference between the 1-1 resonator P11 and the 1-2 resonator P12 is increased, the bandwidth of the graph Pu that expresses the frequency response characteristic of the first resonator group Pu may be widened. Also, when the resonant frequency difference between the 1-1 resonator P11 and the 1-2 resonator P12 is reduced, the bandwidth of the graph Pu may be narrowed. To control a resonant frequency difference, lengths of supporting units of the 1-1 resonator P11 and the 1-2 resonator P12 may be controlled. That is, when a length difference between the supporting units 14 and 24 of the 1-1 resonator P11 and the 1-2 resonator P12 is increased, the bandwidth of the graph Pu may be widened, and when the length difference between the first and second supporting units 14 and 24 is reduced, the bandwidth of the graph Pu may be narrowed. This characteristic may also be equally applied to the filter system 100 including first resonator 10 and the second resonator 20 depicted in FIG. 1.

Figure 10:
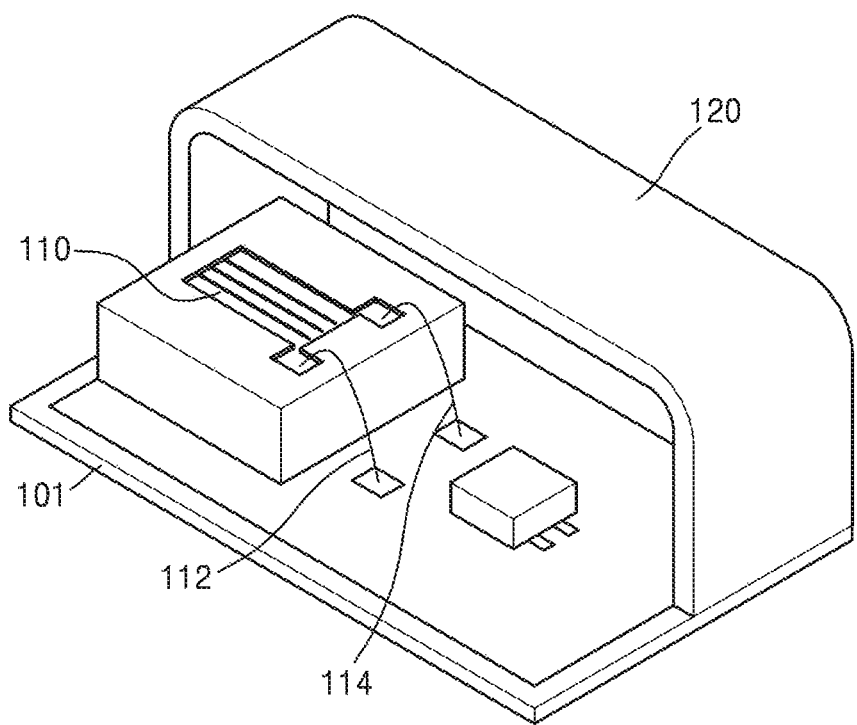
FIG. 10 is a perspective view of an acoustic interface apparatus including a filter system, according to an example embodiment.

FIG. 10 is a perspective view of an acoustic interface apparatus including a filter system, according to an example embodiment.

Referring to FIG. 10, the acoustic interface apparatus may include a base 101, a filter system 110 on the base 101, and transmission lines 112 and 114 that transmit electrical signals from the filter system 110 to an external signal analyzing unit. Here, the base 101 may be a printed circuit substrate and may include the signal analyzing unit that analyzes electrical signals received from the filter system 110 thereon. A housing 120 having a shape surrounding at least a portion of the filter system 110 may be included on the base 101. The housing 120 may reflect sounds, such as noise or voice generated outside the filter system 110, towards the filter system 110. The external sounds may be sensed by resonators included in the filter system 110. Here, the filter system 110 may have a resonator array structure including resonators according to the example embodiments of the inventive concept.

A filter system according to the example embodiments of the inventive concept may be realized as a chip and may be applied to various devices, for example, TVs or automobiles in which an acoustic sensor is needed. The filter system may be used for ensuring an increased voice recognition rate by removing noise from external sounds or for increasing communication quality by allowing recognition of a user's voice without noise. Also, the filter system may also be used for increasing performance of a voice recognition apparatus, such as voice identification devices or hearing aids that perform a frequency analysis of sounds. Also, the filter system may be used as a vibration sensor to sense an external force, such as vibration.

The filter system according to the current inventive concept may minimize a width of a transition region (skirt) between a pass band that is a frequency range of a region to be sensed and a stop band that includes frequency ranges except for the region to be sensed, and thus, may realize a sharp skirt characteristic. Also, a filter system having an improved response characteristic may be realized by controlling an electrode connection structure between the resonators.

While the above example embodiments have been described in detail with reference to accompanying drawings, it may be understood by those of ordinary skill in the art that the example embodiments may be considered in a descriptive sense only and not for purposes of limitation. Therefore, the scope of the inventive concept is defined not by the detailed description of the inventive concept but by the spirit and scope as defined by the appended claims.

What is claimed is:

1. A filter system comprising:
 a first resonator group; and
 a second resonator group,
 wherein the first resonator group comprises:
  a first resonator having a first resonant frequency, and
  a second resonator having a second resonant frequency different from the first resonant frequency,
 wherein the second resonator group comprises:
  a third resonator having a third resonant frequency different from the first and second resonant frequencies, and
  a fourth resonator having a fourth resonant frequency different from the first, second, and third resonant frequencies, and
 wherein a first length difference between the first resonator and the second resonator is less than a second length difference between the second resonator and the third resonator, and a third length difference between the third resonator and the fourth resonator is less than the second length difference between the second resonator and the third resonator,
 wherein the first resonator group and the second resonator group are directly adjacent to each other, and
 wherein the second resonator and the third resonator are directly adjacent to each other.

2. The filter system of claim 1, wherein a first response characteristic of the first resonator and a second response characteristic of the second resonator with respect to a frequency comprise a first section in which a first phase of the first resonator is equal to a second phase of the second resonator, and a second section in which the first phase is different from the second phase by 180 degrees.

3. The filter system of claim 2, wherein the first section is a frequency region less than the first resonant frequency or greater than the second resonant frequency.

4. The filter system of claim 3, wherein, in the first section, a response characteristic of the filter system with respect to the frequency is reduced as much as a difference between a first value of the first response characteristic and a second value of the second response characteristic with respect to the frequency.

5. The filter system of claim 2, wherein the second section is a frequency region between the first resonant frequency and the second resonant frequency.

6. The filter system of claim 5, wherein, in the second section, a response characteristic of the filter system with respect to the frequency, according to a sum of a first value of the first response characteristic and a second value of the second response characteristic with respect to the frequency, is maintained constant.

7. The filter system of claim 2, wherein a third response characteristic of the third resonator and a fourth response characteristic of the fourth resonator with respect to a frequency comprise the first section in which the first phase of the first resonator is equal to the second phase of the second resonator, and the second section in which the first phase is different from the second phase by 180 degrees.

8. The filter system of claim 1, wherein the first resonator comprises a first sensor unit, the second resonator comprises a second sensor unit, the third resonator comprises a third sensor unit, and the fourth resonator comprises a fourth sensor unit.

9. The filter system of claim 8, wherein the first sensor unit comprises a first lower electrode, a first piezo-material layer, and a first upper electrode,
 the second sensor unit comprises a second lower electrode, a second piezo-material layer, and a second upper electrode, and
 the first upper electrode is electrically connected to the second lower electrode.

10. The filter system of claim 8, wherein the first sensor unit comprises a first lower electrode, a first piezo-material layer, and a first upper electrode,
 the second sensor unit comprises a second lower electrode, a second piezo-material layer, and a second upper electrode, and
 the first lower electrode is electrically connected to the second upper electrode.

11. The filter system of claim 8, wherein the third sensor unit comprises a third lower electrode, a third piezo-material layer, and a third upper electrode,
 the fourth sensor unit comprises a fourth lower electrode, a fourth piezo-material layer, and a fourth upper electrode, and
 the third upper electrode is electrically connected to the fourth lower electrode.

12. The filter system of claim 8, wherein the third sensor unit comprises a third lower electrode, a third piezo-material layer, and a third upper electrode, the fourth sensor unit comprises a fourth lower electrode, a fourth piezo-material layer, and a fourth upper electrode, and the third lower electrode is electrically connected to the fourth upper electrode.

13. The filter system of claim 8, further comprising a fixing unit, wherein the first resonator further comprises a first supporting unit extending from the fixing unit, the first supporting unit having a first side on which the first sensor unit is disposed, wherein the second resonator further comprises a second supporting unit extending from the fixing unit, the second supporting unit having a second side on which the second sensor unit is disposed, wherein the third resonator further comprises a third supporting unit extending from the fixing unit, the third supporting unit having a third side on which the third sensor unit is disposed, and wherein the fourth resonator further comprises a fourth supporting unit extending from the fixing unit, the fourth supporting unit having a fourth side on which the fourth sensor unit is disposed.

14. The filter system of claim 13, wherein the first supporting unit has a first length different from a second length of the second supporting unit, and the third supporting unit has a third length different from a fourth length of the fourth supporting unit.

15. The filter system of claim 1, wherein the first resonator comprises a first mass unit provided on a first side of a first supporting unit, and the second resonator comprises a second mass unit provided on a first side of a second supporting unit.

* * * * *